United States Patent [19]

Yomogida et al.

[11] 4,232,236
[45] Nov. 4, 1980

[54] OUTPUT CONVERTING CIRCUIT FOR A PROGRAMMABLE SEQUENCE CONTROLLER

[75] Inventors: Toshihiko Yomogida, Kariya; Yasuo Suzuki, Aichi, both of Japan

[73] Assignee: Toyoda-Koki Kabushiki-Kaisha, Aichi, Japan

[21] Appl. No.: 3,790

[22] Filed: Jan. 16, 1979

[30] Foreign Application Priority Data

Jan. 30, 1978 [JP] Japan .................................. 53-9125

[51] Int. Cl.³ ...................... H03K 17/06; H03K 17/30
[52] U.S. Cl. ............................. 307/297; 307/200 A; 307/290; 307/296 R; 361/92
[58] Field of Search ................... 307/200 A, 297, 296, 307/290, 362; 323/22 T; 361/92

[56] References Cited

U.S. PATENT DOCUMENTS

| | | | |
|---|---|---|---|
| 3,219,911 | 11/1965 | Burfeindt | 307/200 A |
| 3,504,202 | 3/1970 | Rittmann et al. | 307/290 X |
| 3,719,859 | 3/1973 | Frantz et al. | 307/290 X |
| 3,754,182 | 8/1973 | Morris et al. | 323/22 T |
| 3,800,168 | 3/1974 | Cochran | 307/290 |
| 4,151,425 | 4/1979 | Cappa | 307/200 A |

*Primary Examiner*—John S. Heyman
*Attorney, Agent, or Firm*—Oblon, Fisher, Spivak, McClelland & Maier

[57] ABSTRACT

An output circuit for a programmable sequence controller wherein a load drive element control circuit is responsive to a command signal stored in a memory circuit for controlling a load drive element connected between a load and a first electric supply. Between a power input terminal of the load drive element control circuit and a second electric supply, there is connected in series a switching element, which is switched on in response to a signal applied from a supply voltage detecting circuit only when the voltage level of the second electric supply is not lower than a level sufficient for normal and reliable operation of the load drive element control circuit.

4 Claims, 9 Drawing Figures

OUTPUT CONVERTING CIRCUIT FOR A PROGRAMMABLE SEQUENCE CONTROLLER

BACKGROUND OF THE INVENTION

1. Field of the Invention

The present invention relates to a general purpose programmable sequence controller and more particularly, to an output converting circuit for use in such a sequence controller.

2. Description of the Prior Art

Generally, each output converting circuit of a programmable sequence controller is composed of a memory circuit for storing a command signal to energize or deenergize a load, and a load drive element control circuit responsive to the command signal for controlling a load drive element, and these circuits are constructed by semiconductor circuits, such as integrated circuit "IC" logic.

Upon the initial application of power and as the supply voltage rises, the semiconductor circuits are liable to generate their output signals regardless of the logic value of input signals applied thereto, so that the load connected to each output converting circuit may undesirably be erroneously operated.

An output converting circuit used in the past is now described in greater detail with reference to FIGS. 1 and 2. A reference numeral 1 denotes a load drive element comprising relay contact crx, to which a load L is connected. A load drive element control circuit 2 is provided for controlling the opening and closing of the relay contact crx and is composed of a relay coil CRX for the relay contact crx, and inverter IN and a transistor TR. A memory circuit 3 is composed of a flip flop FF for storing a command signal to energize or deenergize the load L. The load L is in connection to an AC 100-volt electric supply 4, while the control circuit 2 is in connection to a DC 5-volt electric supply 5. Onto an output line (a) of the inverter IN is produced a voltage increasing with the supply voltage of the electric supply 5, regardless of the logic level of an input signal applied to the inverter IN upon the initial application of the electric supplies 4 and 5, i.e. the supply voltages thereof, to the associated circuits respectively, and a signal representing the logic of the input signal is output when the supply voltage to the inverter IN is increased to a predetermined voltage level. FIG. 2 (a) shows the wave form of the voltage that appears on the output line (a) of the inverter IN.

The transistor TR, having the output from the inverter IN applied thereto, is also switched on when the supply voltage is increased to a predetermined voltage level. However, the difference in operational characteristics between the transistor TR and the inverter IN causes the same to switch on respectively at different voltage levels, and thus, the collector voltage of the transistor TR may be changed to take such a voltage wave form as indicated in FIG. 2(b). This results in energizing the relay CRX at a certain time as indicated in FIG. 2(c), whereby a brief closing of the relay contact crx is effected to temporarily operate the load L. The temporary operation of the load L, in turn, causes the undesirable operation of an external device, which operation is not based upon an input signal applied to the inverter IN. Particularly, where the external device is used as an interlocking input to another control circuit, an undesireable influence is brought about on the another control circuit.

In order to avoid the foregoing drawbacks, there has heretofore been used an auxiliary relay CRY, as shown in FIG. 4, which is energized when a relay MS1 for hydraulic pump drive is energized for a ready operation by closing a switch PB1 in advance of the starting of control operations, and a normally open contact cry of the relay CRY is connected between the electric supply 4 and a plurality of loads L, as shown in FIG. 3. Further, in the case where no ready operation is performed, there has been used an auxiliary relay CRY, as shown in FIG. 5, which is energized when a time relay TRY energized in response to a start instruction is timed up, and a contact cry of the relay CRY is connected as shown in FIG. 3.

Where in this manner, the auxiliary relay CRY is additionally provided and the relay contact cry is connected serially to the electric supply 4, the relay contact cry is kept necessarily opened at the rise of the supply voltage, and thus, the load L connected to each output converting circuit of the sequence controller can be prevented from being driven even if the load drive element crx of the output converting circuit is temporarily closed. However, in any of the above-noted cases, a malfunction preventing circuit as shown in FIG. 4 or 5 must be provided as an external device in addition to input and output devices of the sequence controller, and this invites a rise of cost due to an increase in number of control circuits components. Further, the provision of the malfunction preventing circuit 4 or 5 not only necessitates the provision of an additional control box and a mounting space therefore, but also brings forth additional works for assembling and wiring.

SUMMARY OF THE INVENTION

Accordingly, it is a primary object of the present invention to provide an improved output converting circuit for a sequence controller capable of preventing the malfunction of a load connected thereto upon the initial application and rise of supply voltages without the provision of any additional external circuit device for prevention of such malfunction.

Another object of the present invention is to provide an improved output converting circuit for a sequence controller wherein the application of a supply voltage to a load drive element control circuit is interrupted until the rise of the supply voltage to a predetermined level so that a load connected to a load drive element is prevented from malfunction.

Another object of the present invention is to provide an improved output converting circuit of the character set forth above wherein until the rise of the supply voltage to a predetermined level, a memory circuit for storing a command signal to energize a load connected to a load drive element is reset, in addition to interrupting the application of the supply voltage to a load drive element control circuit, so that dual preventions of the malfunction of the load are achieved.

Briefly, according to the present invention, there is provided an output converting circuit for a programmable sequence controller, which includes a memory circuit for storing a command signal to energize or deenergize a load, a load driven element connected between the load and a first electric supply, and a load drive element control circuit responsive to the command signal stored in the memory circuit for controlling the load drive element. A switching element is connected in series between a power input terminal of the load drive element control circuit and a second electric supply, and a supply voltage detecting circuit is further provided for detecting a voltage level of the second electric supply so as to output a signal to enable the switching element to switch on only when the voltage level of the second electric supply is higher than a level sufficient for normal operation of the load drive element control circuit. Since the application of the supply voltage to the load drive element control circuit is interrupted until the rise of the supply voltage to such a level, the load drive element can be prevented from being switched on even when the circuit elements such as the memory circuit and the load drive element control circuit otherwise would produce a malfunction. Accordingly, the operation of any external device actuated by the load is effected only upon the application of a command signal to the memory circuit.

BRIEF DESCRIPTION OF THE DRAWINGS

Various other objects, features and attendant advantages of the present invention will readily be appreciated as the same becomes better understood by reference to the following detailed description of a preferred embodiment when considered in connection with the accompanying drawings, wherein like reference numerals designate like or corresponding parts throughout the several views and in which.

DETAILED DESCRIPTION OF A PREFERRED EMBODIMENT

Figure 6:
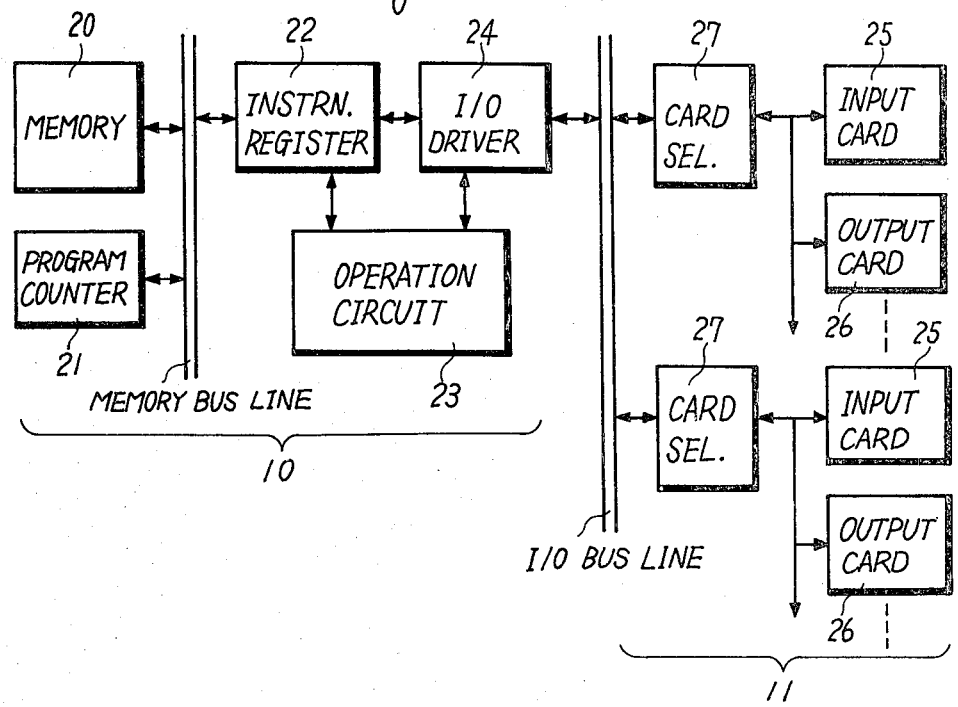
FIG. 6 is a rough block diagram of a programmable sequence controller incorporating a plurality of output converting circuits according to the present invention.

Referring now to the drawings, and more particularly to FIG. 6 thereof, there is illustrated a programmable sequence controller, which comprises an operation processing section 10 and an input and output section 11. The operation processing section 10 is composed of a memory 20 for storing a sequence program including a plurality of program instructions, a program counter 21 for selectively designating addresses of the memory 20, an instruction register 22 for setting therein data read out from the memory 20, a logic operation circuit 23 and an I/O driver 24. The input and output section 11 is composed of a plurality of input cards 25 each for converting the level of ON-OFF signals output from input elements such as push button switches, limit switches, etc., and a plurality of output cards 26 each for energizing or deenergizing loads such as solenoids, relays etc., connected to an electric supply therefore. In each of I/O racks, not shown, containing the input cards 25 and the output cards 26, there is also provided a card selector 27, which is responsive to data included in more significant bits of an operand portion constituting a part of each program instruction of the sequence program, for selecting a specified card designated by the data. Each of the input cards 25 is provided thereon with eight-input converting circuits of the same construction, and each of the output cards 26 is provided with eight output converting circuits of the same construction. Each of the input or output converting circuits provided on each card is selectable by data included in less significant bits of the operand portion. When one of the input converting circuits is selected based upon data of the operand portion of a program instruction, then on ON or OFF signal of an input element connected to the selected input converting circuit is converted into a predetermined voltage level and is applied to the operation circuit 23 for logic operation. On the other hand, when one of the output converting circuits is selected, then a load connected to the selected output converting circuit is controlled to be energized or deenergized in dependence upon the result of such a logic operation. The sequence controller of this type has been well-known in the art as fully described in, for example, U.S. Pat. No. 4,048,622 to one of Applicants of this application, and therefore, the further detailed description of the sequence controller will be omitted for the sake of brevity.

Figure 1:
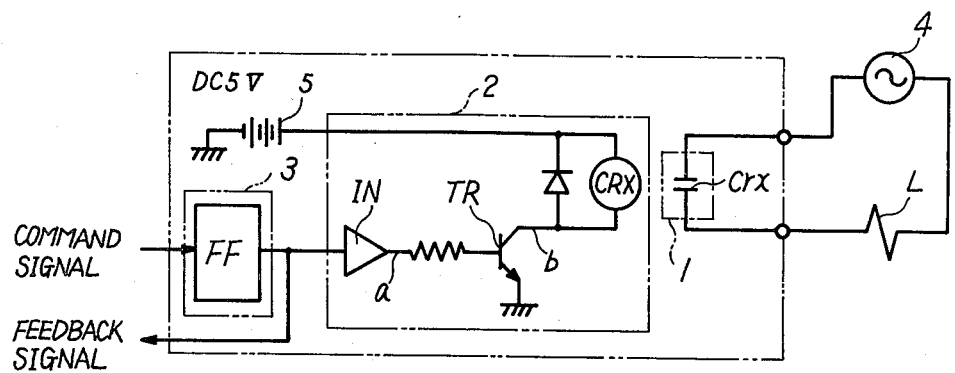
FIG. 1 is a circuit diagram of a prior art output converting circuit.
Figure 2:
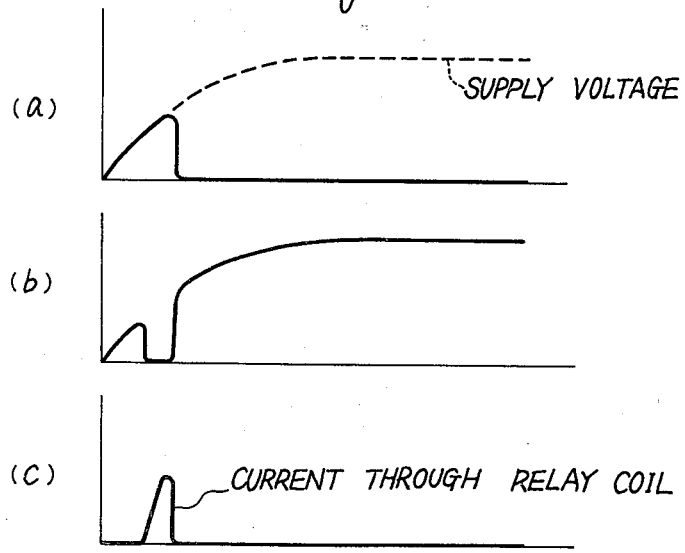
FIG. 2 is a series of graphs showing waveforms of voltages at strategic points of the circuit shown in FIG. 1 at the time of the rise of a supply voltage.
Figure 3:
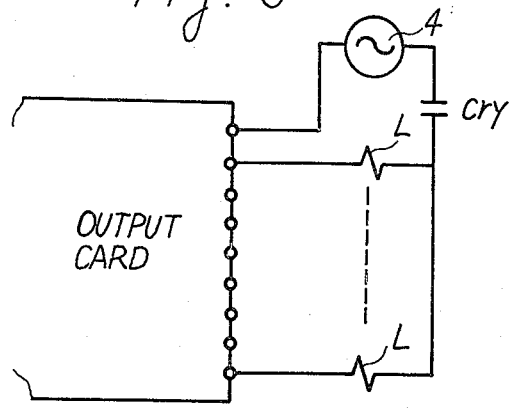
FIG. 3 is a circuit diagram illustrating a connecting relation between an output card of a prior art sequence controller and a plurality of loads connected thereto.
Figure 4:
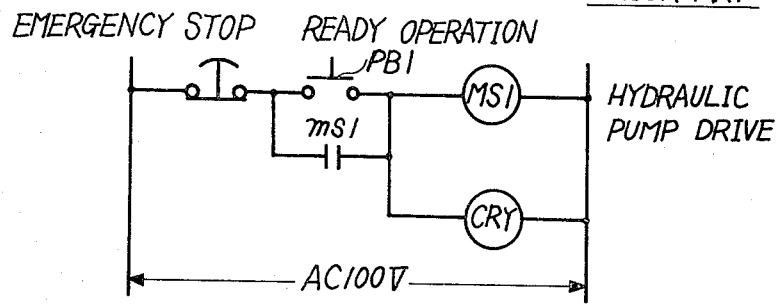
FIG. 4 is a ladder diagram of one example of a malfunction preventing circuit of the prior art provided externally to the sequence controller.
Figure 5:
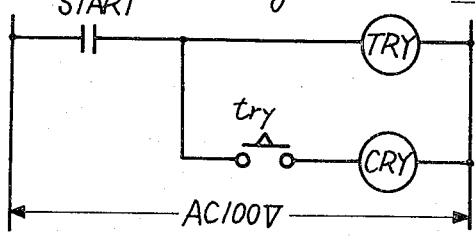
FIG. 5 is a ladder diagram of another example of a prior art malfunction preventing circuit.
Figure 7:
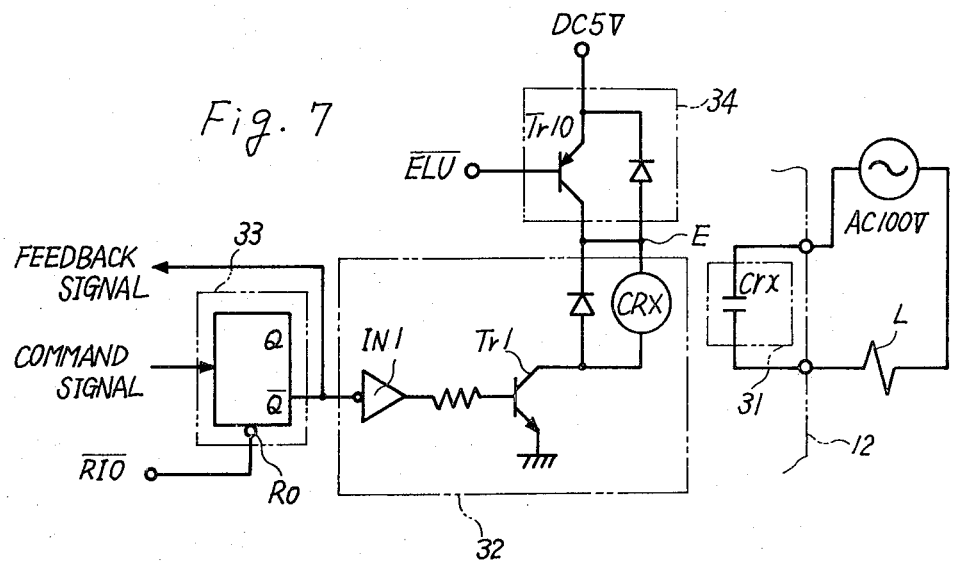
FIG. 7 is a detailed circuit diagram of each of the output converting circuits.
Figure 8:
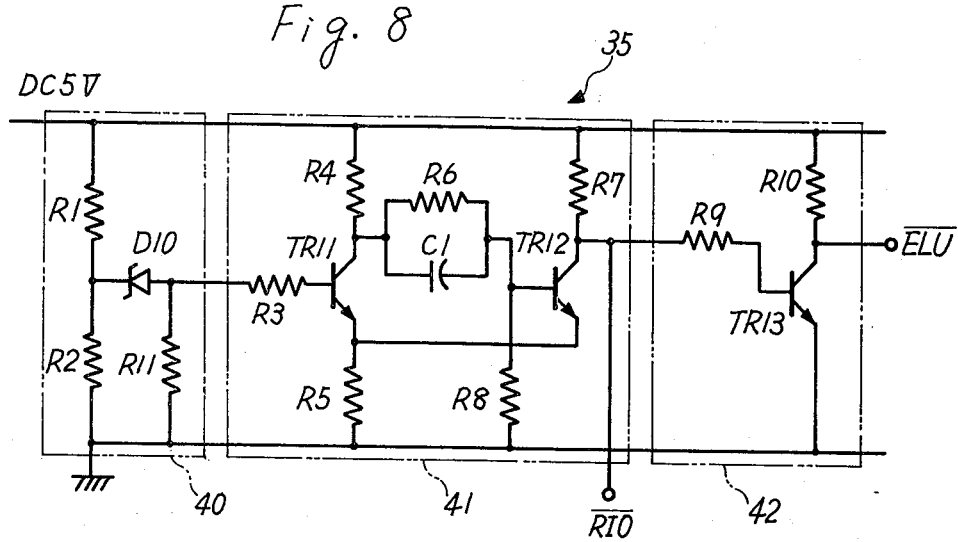
FIG. 8 is a circuit diagram of a supply voltage detecting circuit used together with the circuit shown in FIG. 7.
Figure 9:
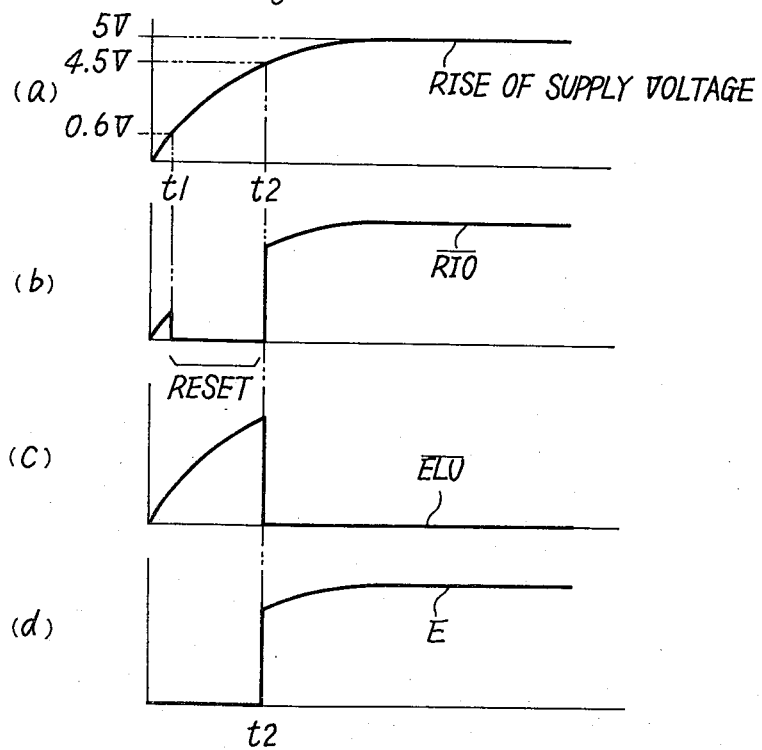
FIG. 9 is a series of graphs showing waveforms of voltages at strategic points of the circuits shown in FIGS. 7 and 8 at the time of the rise of a supply voltage.

FIG. 7 illustrates the construction of each of the output converting circuits 12. The detailed description is omitted with respect to a load drive element 31, a load drive element control circuit 32 and a memory circuit 33, since these circuit components have the same construction as those shown in FIG. 1. Connected between one end of a relay coil CRX constituting the load drive element control circuit 32 and a DC 5-volt electric supply is a switching element 34 comprising a transistor Tr10, a base terminal of which is connected to a first terminal $\overline{ELU}$ of a supply voltage detecting circuit 35, shown in FIG. 8, provided in each of the card selectors 27. Further, a reset terminal Ro of the memory circuit 33 is connected to the second terminal $\overline{RIO}$ of the supply voltage detecting circuit 35. In this supply voltage detecting circuit 35, resistors R1 and R2 constitute a voltage dividing circuit of a level detecting circuit 40 for setting a detection level of a supply voltage relative to a zener voltage of a zener diode D10. The detection level of the supply voltage is determined to be sufficient for normal and reliable operation of the load drive element control circuit 32. Transistors Tr11 and Tr12 constitute a Schmidt's circuit 41, and when the supply voltage rises above the detection level, the transistor Tr11 is switched on while the transistor Tr12 is switched off. When the supply voltage is below the detection level, the transistor Tr12 is switched on to maintain its collector voltage at a low level. On the contrary, when the supply voltage is above the detection level, the collector voltage of the transistor Tr12 is maintained at a high level. That is, the collector voltage of the transistor Tr12 is changed to take such a voltage waveform as indicated in FIG. 9(b) and is applied as a reset signal to the memory circuit 33 through the second terminal $\overline{R10}$. Thus, the memory circuit 33 is reset while time goes from t1 to t2 in the time that supply voltage rises, and is relieved of such resetting after the time t2. For inverting the collector voltage of the transistor Tr12, there is connected an inverting circuit 42 comprising a transistor Tr13, which is switched off while the transistor Tr12 is switched on and is switched on while the transistor Tr12 is switched off. The collector voltage of the transistor Tr13 is changed to take such a voltage wave form as indicated in FIG. 9(c) and is applied to the switching element 34 through the first terminal $\overline{\text{ELU}}$. At the time t2, the signal appearing on the first terminal $\overline{\text{ELU}}$ is lowered on the low level, and this causes the switching element 34 to be switched on, whereby the supply voltage is applied to the relay coil CRX of the load drive element control circuit 32. It will therefore be understood that before the time t2, the load L is prevented from being undesirably energized even when a transistor Tr1 of the control circuit 32 would otherwise be temporarily switched on.

Further, it is uncertain whether at the rise of the supply voltage, the memory circuit 33 is turned either to a set state of a reset state. However, during the time from t1 to t2, the memory circuit 33 is reset as receiving a reset signal from the supply voltage detecting circuit 35. Thus, at the time t2 when the supply voltage is applied to the relay coil CRX, the undesirable energization of the load L can be perfectly avoided since the memory circuit 33 has already been reset.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. An output converting circuit for a programmable sequence controller wherein, in accordance with a sequence control program, the operational state of an input element is tested so as to generate a command signal to energize or deenergize a load based upon the result of the test, comprising:
    a memory circuit for storing said command signal;
    a load drive element connected between said load and a first electric supply;
    a load drive element control circuit responsive to said command signal stored in said memory circuit for controlling said load drive element;
    a switching element connected in series between a power input terminal of said load drive element control circuit and a second electric supply; and
    a supply voltage detecting circuit for detecting a voltage level of said second electric supply so as to output a signal to enable said switching element to switch on only when the voltage level of said second electric supply is not lower than a predetermined level sufficient for normal operation of said load drive element control circuit.

2. An output converting circuit as set forth in claim 1, wherein said supply voltage detecting circuit comprises:
    a first circuit for generating a detection signal when the supply voltage of said second electric supply rises to said predetermined voltage level; and
    a second circuit coupled to said first circuit for squaring the rise of said detection signal output from said first circuit, said switching element being switched on based upon a squared detection signal output from said second circuit.

3. An output converting circuit as set forth in claim 2, wherein said supply voltage detecting circuit further comprises:
    a third circuit connected between said second circuit and said switching element for inverting said squared detection signal applied to said switching element.

4. An output converting circuit as set forth in claim 2 or 3, wherein said memory circuit comprises:
    a flip flop circuit having a compulsory reset terminal connected to said second circuit for being compulsorily reset in response to said squared detection signal output from said second circuit.

* * * * *